US011942537B2

(12) United States Patent
Shealy et al.

(10) Patent No.: US 11,942,537 B2
(45) Date of Patent: Mar. 26, 2024

(54) VERTICAL FIELD EFFECT TRANSISTOR DEVICE AND METHOD OF FABRICATION

(71) Applicant: Odyssey Semiconductor, Inc., Ithaca, NY (US)

(72) Inventors: James R. Shealy, Ithaca, NY (US); Richard J. Brown, Ithaca, NY (US)

(73) Assignee: Odyssey Semiconductor, Inc., Ithaca, NY (US)

( * ) Notice: Subject to any disclaimer, the term of this patent is extended or adjusted under 35 U.S.C. 154(b) by 0 days.

(21) Appl. No.: 18/304,194

(22) Filed: Apr. 20, 2023

(65) Prior Publication Data

US 2023/0387289 A1 Nov. 30, 2023

Related U.S. Application Data

(60) Continuation of application No. 17/576,355, filed on Jan. 14, 2022, now Pat. No. 11,652,165, which is a division of application No. 16/814,886, filed on Mar. 10, 2020, now Pat. No. 11,251,295.

(51) Int. Cl.
*H01L 29/78* (2006.01)
*H01L 29/10* (2006.01)
*H01L 29/20* (2006.01)
*H01L 29/66* (2006.01)

(52) U.S. Cl.
CPC ...... *H01L 29/7802* (2013.01); *H01L 29/1095* (2013.01); *H01L 29/2003* (2013.01); *H01L 29/66522* (2013.01); *H01L 29/66712* (2013.01)

(58) Field of Classification Search
CPC ............ H01L 29/0619; H01L 29/1095; H01L 29/2003; H01L 29/66522; H01L 29/66712; H01L 29/66909; H01L 29/7802; H01L 29/8083
USPC .......................................................... 257/76
See application file for complete search history.

(56) References Cited

U.S. PATENT DOCUMENTS

2012/0261675 A1* 10/2012 Casady ............... H01L 29/1608
257/77
2014/0346528 A1* 11/2014 Hisada .............. H01L 29/66037
257/77

* cited by examiner

*Primary Examiner* — Fazli Erdem
(74) *Attorney, Agent, or Firm* — Richard T. Ogawa; Ogawa P.C.

(57) ABSTRACT

A method and vertical FET device fabricated in GaN or other suitable material. The device has a selective area implant region comprising an activated impurity configured from a bottom portion of a recessed regions, and substantially free from ion implant damage by using an annealing process. A p-type gate region is configured from the selective area implant region, and each of the recessed regions is characterized by a depth configured to physically separate an n+ type source region and the p-type gate region such that a low reverse leakage gate-source p-n junction is achieved. An extended drain region is configured from a portion of an n– type GaN region underlying the recessed regions. An n+ GaN region is formed by epitaxial growth directly overlying the backside region of the GaN substrate and a backside drain contact region configured from the n+ type GaN region overlying the backside region.

20 Claims, 14 Drawing Sheets

VERTICAL FIELD EFFECT TRANSISTOR DEVICE AND METHOD OF FABRICATION

CROSS-REFERENCES TO RELATED APPLICATIONS

This application is a continuation application of U.S. patent application Ser. No. 17/576,355, filed on Jan. 14, 2022, which is a divisional application of U.S. patent application Ser. No. 16/814,886, filed Mar. 10, 2020, now U.S. Pat. No. 11,251,295, which is incorporated by reference herein for all purposes.

BACKGROUND OF THE INVENTION

The present invention provides techniques for a high voltage field effect transistor ("FET") configured on a gallium and nitrogen containing material. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

High voltage switching devices have revolutionized the world. High voltage switches devices are used in all power converters such as those in modern day electric cars, such as the Model S manufactured by Tesla, Inc. Traditional horizontal high voltage device approaches are limited to 600 to 900 Volts. Such horizontal high voltage device approaches are limited by the introduction of defects generated by the lattice mismatch of semiconductor materials. The lattice mismatch leads to problems in quality, reliability, and limitations in voltage capability. Other high voltage device approaches such as those grown on bulk crystalline devices are improved. Although many advances have occurred in the field of high voltage switching devices, and their processing, various limitations still exist.

From the above, it is seen that techniques for improving electronic devices are highly desirable.

BRIEF SUMMARY OF THE INVENTION

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

In an example, the present invention provides a vertical FET device fabricated in GaN or other suitable material. In an example, the device has a GaN substrate comprising a surface region and a backside region. The device has an n-type GaN epitaxial layer overlying the surface region. The device has a plurality of finger regions, each of the finger regions having a portion of the n-type GaN epitaxial layer, an n+ type portion, and a capping layer. In an example, the device has a plurality of recessed regions, each of the recessed regions formed between each pair of finger regions. The device has an n− type GaN channel comprising a doping level and a thickness selected to provide a large gate-drain breakdown voltage in a range from 100 volts to 20 kilovolts. The device has an n+ type source configured from the n+ type portion of the finger region. The device has a selective area implant region comprising an activated impurity selected from at least one of Be, Mg, Zn, Ca, and Cd configured from a bottom portion of the recessed regions and configured to be substantially free from ion implant damage using an annealing process. The device has a p-type gate region configured from the selective area implant region. The device has a depth characterizing each of the recessed regions configured to provide physical separation between the n+ type source region and the p-type gate region such that a low reverse leakage gate-source p-n junction is achieved. The device has an extended drain region configured from a portion of n− type GaN region underlying the recessed regions. The device has an n+ GaN region formed by epitaxial growth directly overlying the backside region of the GaN substrate and a backside drain contact region configured from the n+ type GaN region overlying the backside region.

One or more benefits are achieved over pre-existing techniques using the invention. In particular, the invention enables a cost-effective technique for providing improved electrical characteristics of a gallium and nitrogen containing material. In an example, the technique uses a beryllium species configured with implantation techniques into a crystalline gallium and nitrogen containing material to form a low resistivity material for switching devices, among others. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline or can be other configurations. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

According to the present invention, techniques for a high voltage field effect transistor ("FET") configured on a gallium and nitrogen containing material are provided. In an example, the present invention includes a method and resulting structure for a FET configured in a region of gallium and nitrogen containing material, such as GaN or AlGaN. Merely by way of example, the invention has been applied to a high voltage FET device. However, the techniques can be applied other types of device structures and applications.

Figure 1:
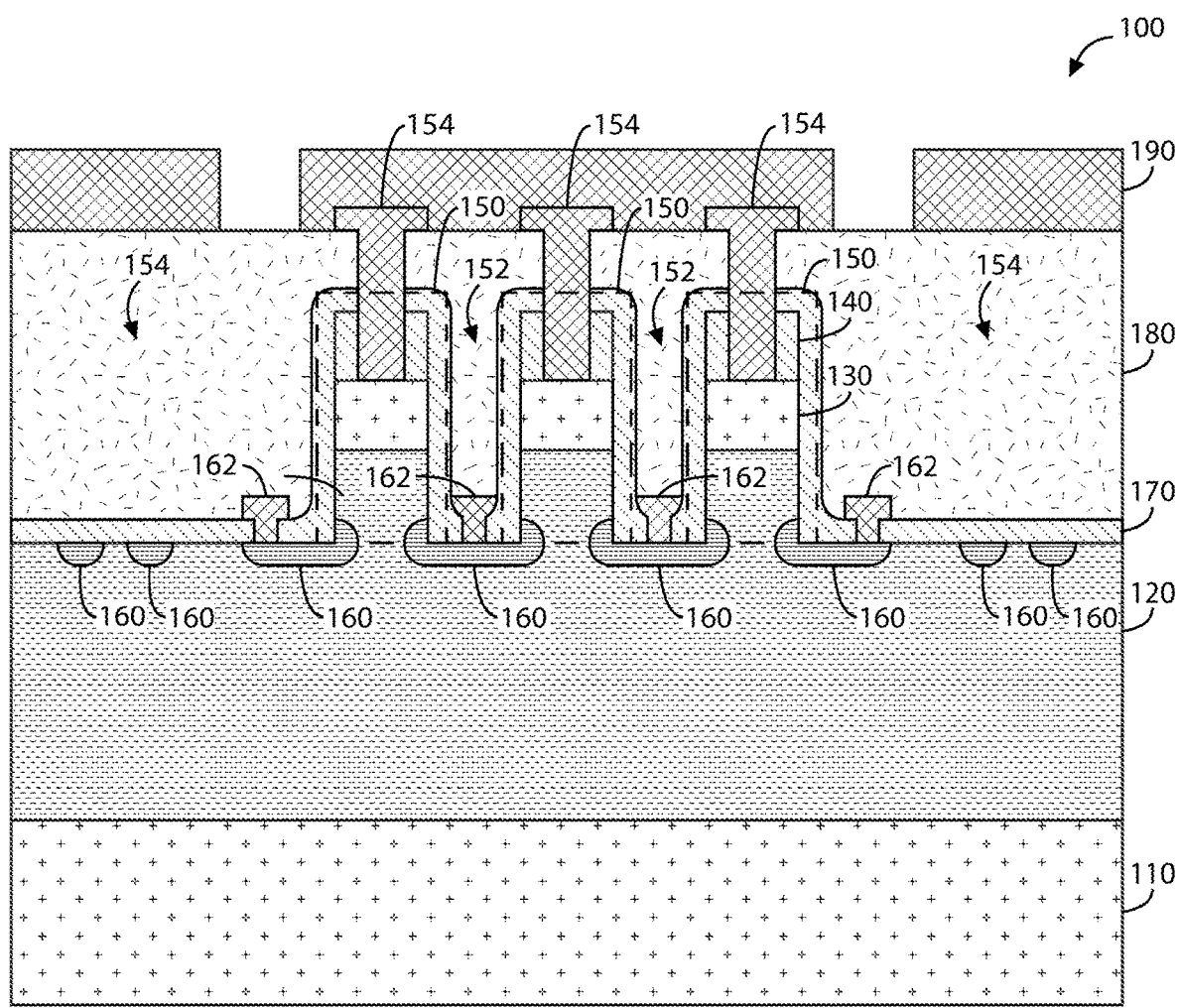
FIG. 1 is a simplified diagram of a vertical FET device configured on a GaN substrate according to an example of the present invention.

FIG. 1 is a simplified diagram of a vertical FET device configured on a GaN substrate according to an example of the present invention. As shown, the present invention provides a vertical FET device fabricated in GaN or other suitable material. In an example, the device 100 has a GaN substrate 110 comprising a surface region and a backside region. In an example, the GaN substrate 110 is n+ type or another type.

As shown, the device 100 has an n− type GaN epitaxial layer 120 overlying the surface region. The device has a plurality of finger regions 150, each of the finger regions 150 having a portion of the n− type GaN epitaxial layer 120, an n+ type portion 130, and a capping layer 140. In an example, the device has a plurality of recessed regions 152, each of the recessed regions 152 formed between each pair of finger regions 150. The device 100 has an n− type GaN channel comprising a doping level and a thickness selected to provide a large gate-drain breakdown voltage in a range from 100 volts to 20 kilo-volts. The device 100 has an n+ type source configured from the n+ type portions 130 of the finger regions 150 and including n-type metal contact regions 154.

In an example, the device 100 has a plurality of selective area implant regions 160 comprising an activated impurity selected from at least one of Be, Mg, Zn, Ca, and Cd configured from at least a bottom portion of the recessed regions 152 and configured to be substantially free from ion implant damage using an annealing process. The device 100 has a p-type gate region configured from the selective area implant regions 160 and including p-type metal contact regions 162. The device 100 has a depth characterizing each of the recessed regions 152 configured to provide physical separation between the n+ type source region and the p-type gate region such that a low reverse leakage gate-source p-n junction is achieved.

The device 100 has an extended drain region configured from a portion of the n− type GaN region 120 underlying the recessed regions 152. In an example, the device 100 has an n+ GaN region formed by epitaxial growth directly overlying the backside region of the GaN substrate 110 and a backside drain contact region configured from the n+ type GaN region overlying the backside region. In an example, the device has a drain region configured from the backside region of the GaN substrate 110 configured as an n+ type GaN substrate.

In an example, the n+ source region or regions are provided by a donor impurity ion implantation and a subsequent annealing process. In an example, the source region or regions are provided with silicon as a donor impurity. In an example, the channel region or regions are provided with silicon as a donor impurity. In an example, the device 100 has a dielectric spacer layer 170 deposited conformally overlying the recessed regions 152 to limit a lateral penetration of a subsequent ion implant of acceptors into the n-type GaN channel. In an example, the device 100 has a dielectric spacer layer 170 deposited conformally overlying the recessed regions 152 to encapsulate and passivate a plurality of GaN exposed surfaces between the n+ type source and the p-type gate region.

In an example, the device 100 has a trench region 154 configured around a periphery of a device region, the trench region 154 comprising a dielectric fill material 180 and configured to form an isolation region. In an example, the dielectric fill material 180 is at least one of SiN, a mixed dielectric AlSiN, or AlN.

In an example, device 100 includes a pad metal contact layer 190 connecting each of the n-type contact metal regions 154 and connecting each of the p-type metal contact regions 162. In an example, the device 100 has a built-in voltage of a gate-source diode is approximately 3 volts to achieve a wider channel width as compared to a metal-insulator-semiconductor gate structure for a normally-off enhancement mode device.

Those of ordinary skill in the art will recognize other variations, modifications, and alternatives to the configurations and materials described above. Further details of techniques including a method of fabricating the device can be found throughout the present specification and more particularly below.

A method of fabricating a high-voltage switching device or vertical FET device according to an example of the present invention is briefly described as follows:

1. Provide a GaN Substrate, having a surface region and a backside region;
2. Form a first n+ type GaN layer overlying the surface region;
3. Form a n− type GaN layer overlying the first n+ type GaN layer;
4. form a second n+ type GaN layer overlying the n-type GaN layer; Form a hard mask material overlying the second n+ type GaN layer, where the hard mask material has a hard mask surface region;
6. Pattern the hard mask material to expose a plurality of trench regions;
7. Subject the plurality of trench regions to a reactive ion etching process including a chlorine gas, boron tri chloride, and argon gas to cause formation of the plurality of trench regions, each of which has a selected depth extending vertically from the hard mask surface region and causing formation of a plurality of finger regions, each of which is disposed between a pair of trench regions;
8. Subject an exposed region of each of the finger regions and a bottom portion of the trench region to a wet chemical etch to cause exposure to a plurality of principle crystalline planes, including an m-plane and a c-plane or an a-plane or a c-plane;
9. Form a thickness of a conformal layer overlying exposed surfaces of each of the fingers, the trench regions, and a peripheral region;
10. Perform an implantation process using a beryllium bearing species to form a plurality of implanted regions, each of which is spatially disposed between each pair of fingers, to form an outer implanted region on each exterior finger region, and to form a peripheral implant region;
11. Activate, using an annealing process, the beryllium bearing species in the plurality of implanted regions, the outer implanted region, and the peripheral implanted region such that the activating forms a plurality of p-type regions;
12. Form a plurality of p-type metal contact regions, each of the p-type metal contact regions formed overlying one of the p-type regions;
13. Form a thickness of planarizing material overlying a surface region including each of the finger regions, the trench regions, and the peripheral region;
14. Form a plurality of openings, each of the openings exposing a portion of the second n+ type layer included in the finger region;
15. Form a plurality of n-type contact metals each of which is connected to the portion of the n− type layer included in the finger region; whereupon the high voltage switching device is configured from a drain region configured from the backside region of the gallium and nitrogen containing substrate member, a gate region configured from connection to each of the p-type metal contact regions, a channel region configured between a pair of p-type regions, and a source region configured from connection to each of the n-type contact metals; and 16. Perform other steps, as desired.

The above sequence of steps is used to form high voltage FET devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

FIGS. 2 to 14 are diagrams illustrating a method of fabricating the vertical FET device according to an example of the present invention. The same reference numbers used across FIGS. 2 to 14 refer to the same elements of the vertical FET device. These diagrams are merely examples, and should not unduly limit the scope of the claims herein. One of ordinary skill in the art would recognize other variations, modifications, and alternatives.

Figure 2:
FIGS. 2 to 14 illustrate a method of fabricating the vertical FET device according to an example of the present invention.

Referring to FIG. 2, the method includes providing a gallium and nitrogen containing substrate 210. The substrate can be a GaN substrate, having a surface region and a backside region. The GaN substrate 210 is homogeneously doped and can be conductive or non-conductive. In an example, the GaN substrate 210 can be a grown substrate or a bulk GaN substrate, among others.

Figure 3:

In an example referring to FIG. 3, the method forms a first n+ type GaN layer 310 overlying the surface region of substrate 210. The first n+ type GaN 310 is epitaxially grown using a MOCVD reactor, or the like. The first n+ type GaN 310 is formed using a tri-ethyl gallium and an ammonia gas. In an example, the epitaxial material has a thickness of about 0.5 to 2.0 microns or can be others. The n+ type characteristic is provided by a silicon dopant derived from a silane gas.

In an example, the method forms an n– type GaN layer 320 overlying the first n+ type GaN layer 310. The n– type GaN 320 is epitaxially grown using a MOCVD reactor, or the like. The n– type GaN 320 is formed using a tri-ethyl gallium and an ammonia gas. In an example, the epitaxial material has a thickness of about 1 to 200 microns or can be others. The n– type characteristic is provided by a silicon dopant derived from a silane gas. In an example, the thickness is adjusted to adjust a breakdown voltage of the field effect device.

In an example, the method forms a second n+ type GaN layer 330 overlying the n-type GaN layer 320. The second n+ type GaN 330 is epitaxially grown using a MOCVD reactor, or the like. The second n+ type GaN 330 is formed using a tri-ethyl gallium and an ammonia gas. In an example, the epitaxial material has a thickness of about 50 to 200 nanometers or can be others. The n+ type characteristic is provided by a silicon dopant derived from a silane gas.

Figure 4:
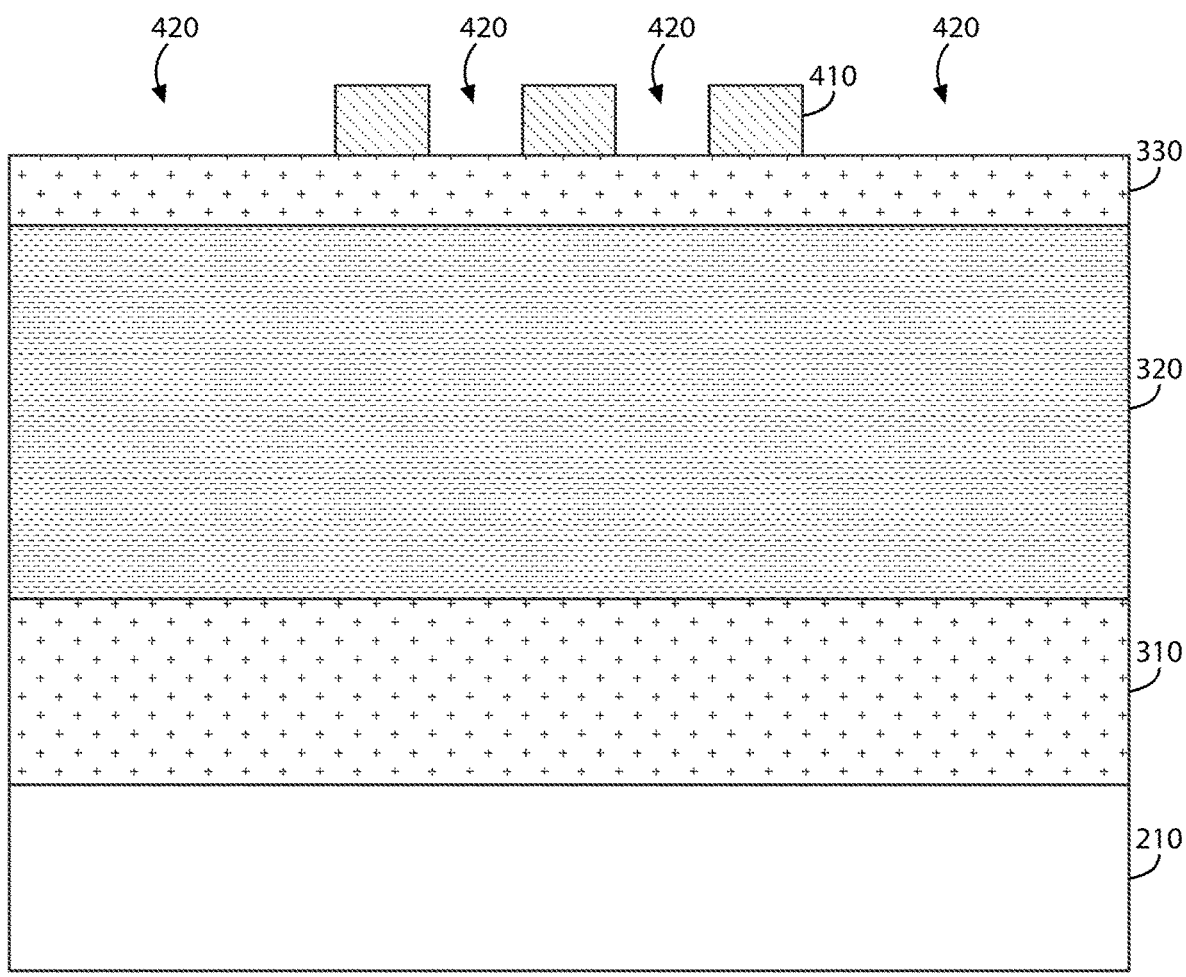

In an example referring to FIG. 4, the method includes forming a hard mask material 410 overlying the second n+ type GaN layer 330. In an example, the hard mask material 410 has a hard mask surface region. In an example, the hard mask material is a silicon nitride, silicon dioxide, or other materials and combinations thereof. In an example, the method includes patterning the hard mask material 410 to expose a plurality of trench regions 420, as shown. In an example, the patterning occurs by using a photolithography process or other like process.

Figure 5:
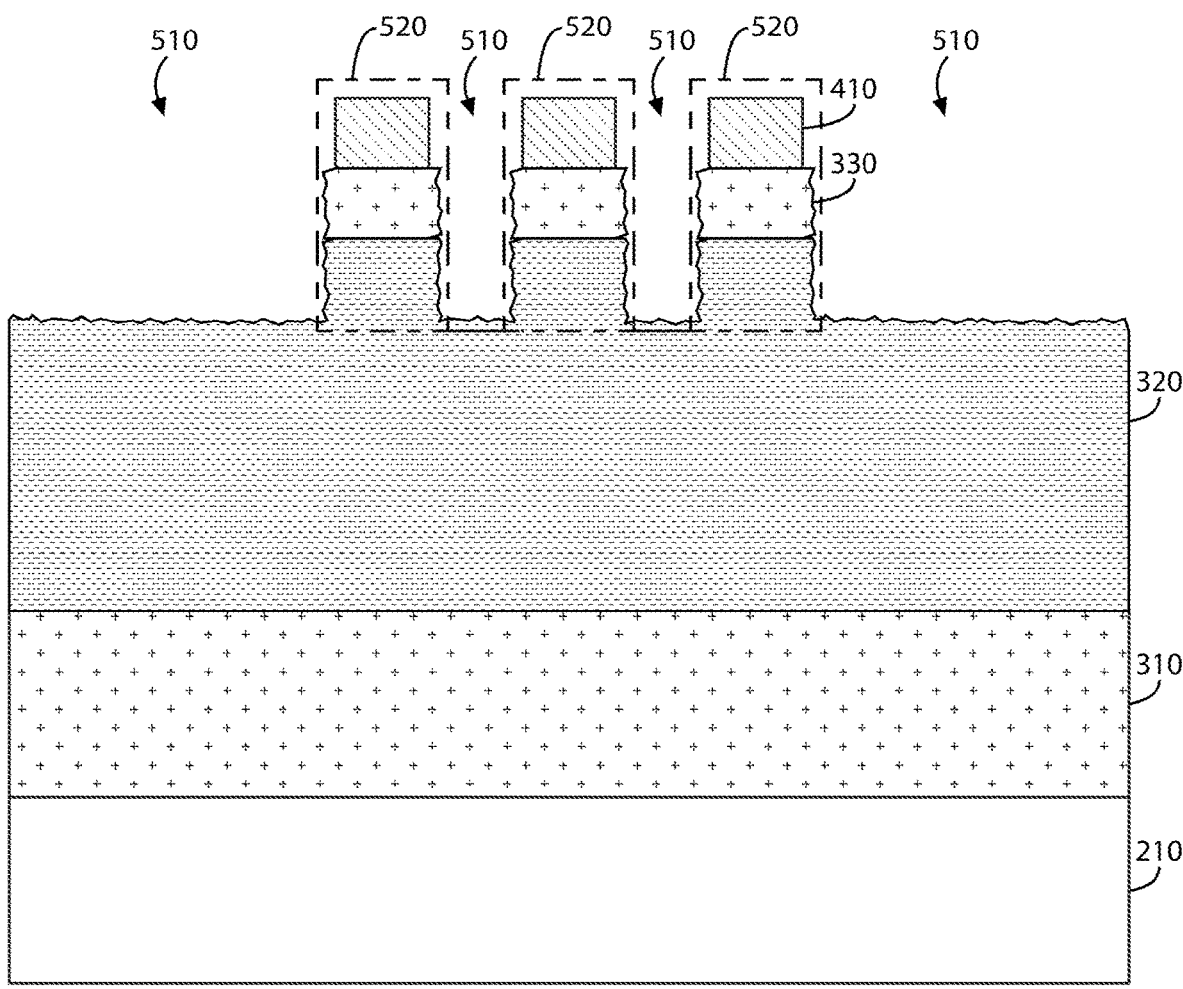

In an example referring to FIG. 5, the method includes subjecting the plurality of trench regions 420 using a reactive ion etching process. In an example, the reactive ion etching process uses a chlorine gas, boron tri chloride, and argon gas. The etching process forms the plurality of trench regions 510. Each of the trench regions 510 has a selected depth extending vertically from the hard mask surface region. Each trench 510 extends through a portion of the hard mask 410, a portion of the second n+ type region 330, and a portion of the n– type region 320. In an example, the trench region 510 has an aspect ratio of four-to-one (depth-to-width) to ten-to-one, but can be others. In an example, the trench region 510 causes formation of a plurality of finger regions 520, each of which is disposed between a pair of trench regions 510. Each of the finger regions 520 is a stack including the portion of the hard mask 410, the second n+ type region 330, and the n– type region 320. After reactive ion etching, exposed surfaces of the finger regions 520 and trenches 510 are rough.

Figure 6:
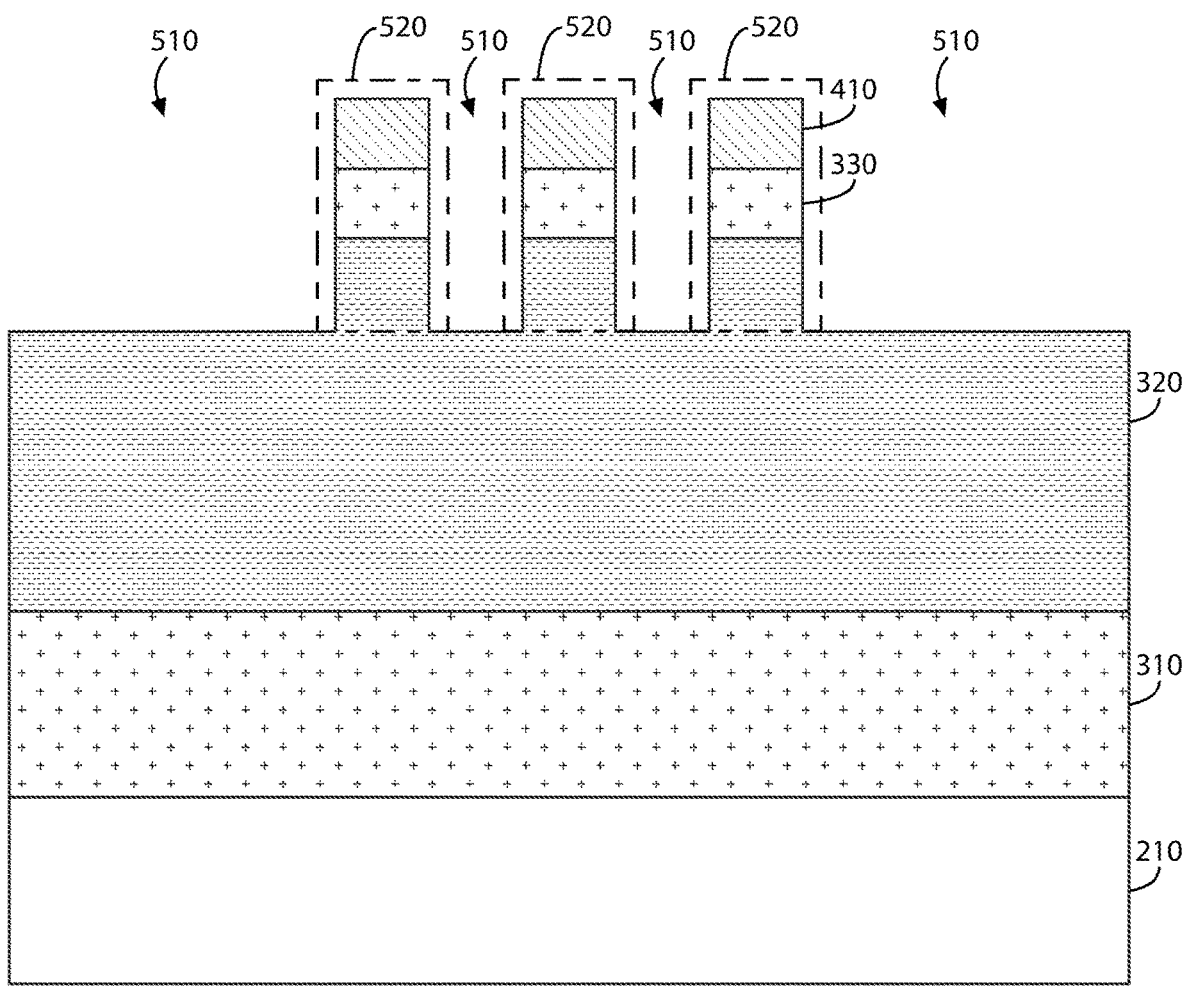

In an example referring to FIG. 6, the method includes subjecting an exposed region of each of the finger regions 520 and a bottom portion of the trench region 510 to a wet chemical etchant. In an example, the wet chemical etch removes surface roughness and causes exposure of a plurality of principle crystalline planes, including an m-plane and a c-plane or an a-plane or a c-plane. In an example, the wet chemical etch comprises tetramethylammonium hydroxide (TMAH) diluted in a water at an elevated temperature ranging from about 50 Degrees Celsius to about 150 Degrees Celsius. Or course, there can be other variations, modifications, and alternative.

Figure 7:
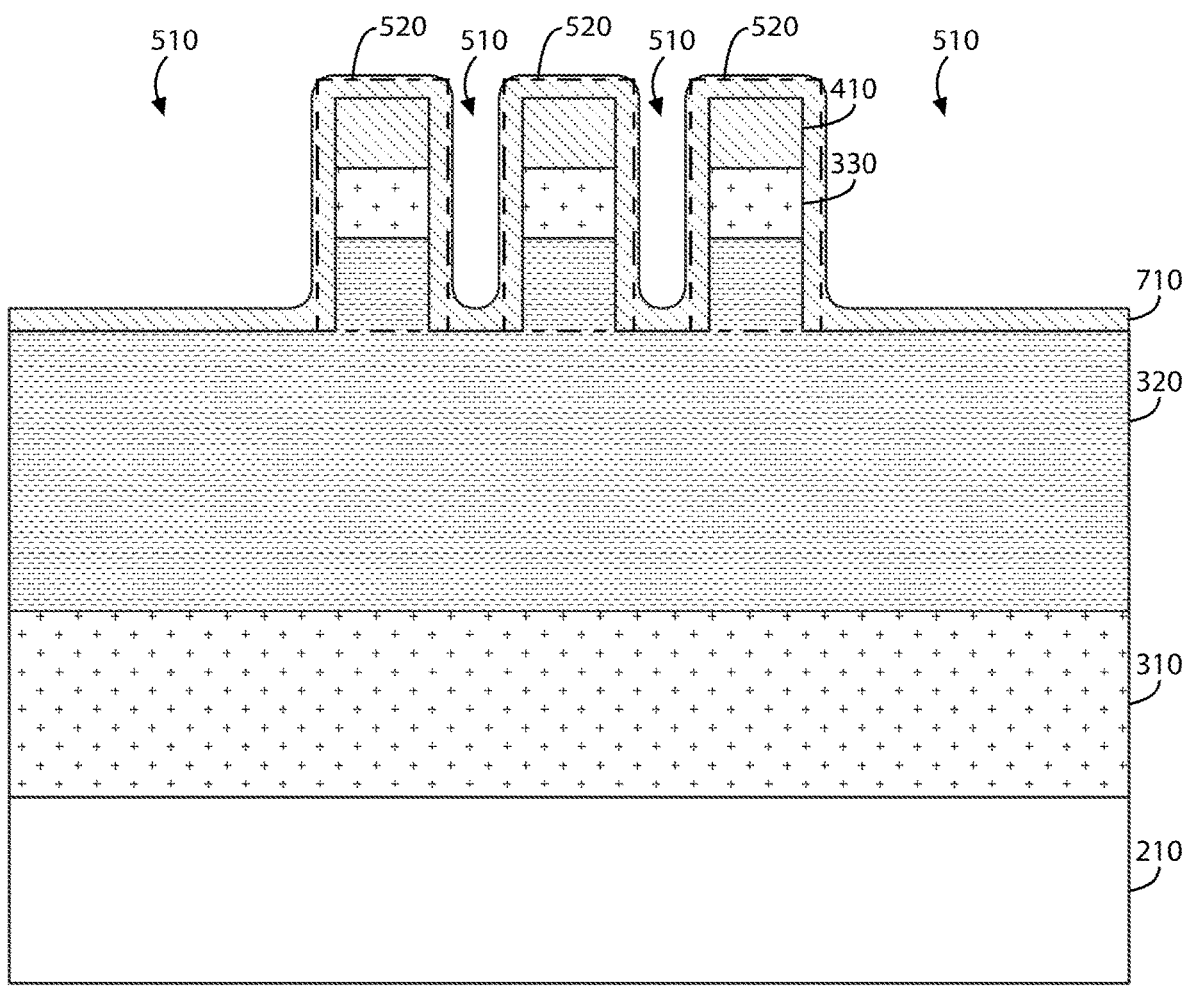

As shown in FIG. 7, the method includes forming a thickness of a conformal layer 710 overlying exposed surfaces of each of the fingers 520, the trench regions 510, and a peripheral region. As shown, the conformal layer 710 is a blanket layer and covers an entirety of the exposed surfaces. The conformal layer 710 has thickness of about 25 to 300 nanometers. In an example, the conformal layer 710 is silicon dioxide, silicon nitride, or other materials and combinations thereof. The conformal layer 710 is substantially free from any pinholes or other imperfections.

Figure 8:
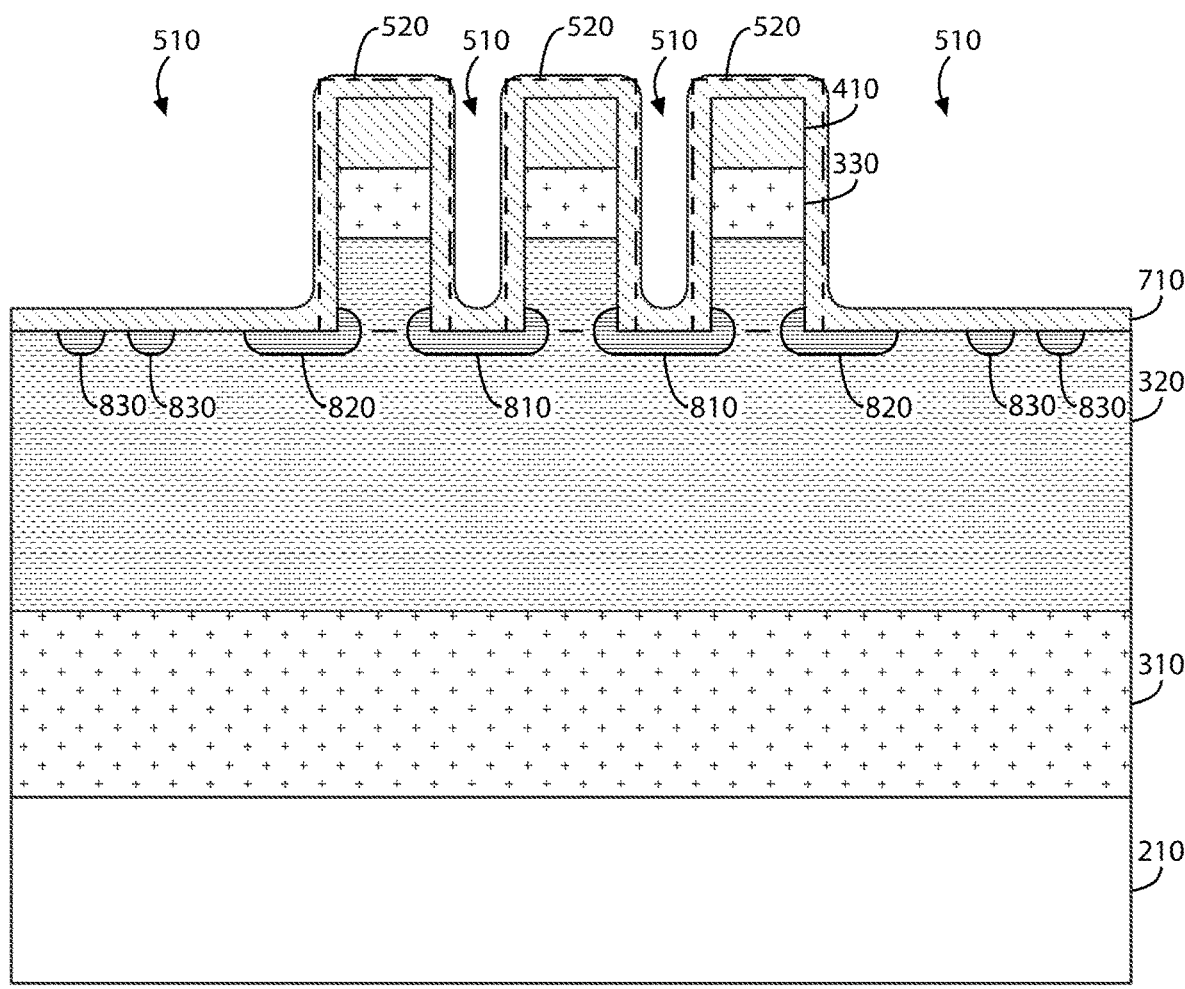

Referring to FIG. 8, the method includes performing an implantation process using a beryllium bearing species to form a plurality of implanted regions 810. Each of the implanted regions 810 is spatially disposed between each pair of fingers 520. The implantation process also forms an outer implanted region 820 on each exterior finger region. The process also forms one or more peripheral implant regions 830. In an example, each of the implant regions has a depth of 10 nanometers to 1000 nanometers, or can be others. In an example, each of the implanted regions extends to a region outside of the trench region 510 and extends into each edge of the finger regions 520.

In an example, the method includes activating, using an annealing process, the beryllium bearing species in the plurality of implanted regions 810, the outer implanted regions 820, and the peripheral implanted regions 830. The activation forms a plurality of p-type regions.

As shown, prior to annealing, a capping layer (i.e., hard mask 410) was grown on the implanted surface. The capping layer serves to prevent nitrogen loss in addition to using the short duration high temperature anneal step. The annealing process begins with an isothermal anneal at 1000° C. in hydrogen and ammonia gas near atmospheric pressure. The ammonia prevents nitrogen loss and introduces atomic hydrogen in the crystal. This step removes much of the ion implant damage, but it fails to activate the group II acceptor impurities. The acceptor activation is realized in the next process step. To activate the magnesium or beryllium acceptors, an activation temperature of 1500° C. is desired while simultaneously preventing nitrogen loss from the crystal. To accomplish this, the time of the thermal anneal must be reduced to the nanosecond time scale. This was achieved by exposing the implanted wafer surface to a pulsed laser annealing using an XeCl excimer laser (wavelength is 308 nm). The pulse energy density was 600 mJ/cm2 and a pulse duration of 30 nano-seconds. The 3 mm by 3 mm exposure aperture was scanned across the entire wafer surface one pulse at a time. The wafer surface temperature was over 1000° C. for 10 nano-second and reached a peak temperature of 1500° C. The appearance of the wafer's surface did not change during this treatment. Higher pulse energy densities produced gallium droplets on the wafer surface indicating severe nitrogen loss. The final process step is an isothermal anneal in nitrogen gas at 800° C., which is a sufficiently low temperature to avoid nitrogen loss from the wafer surface. This anneal is designed to remove atomic hydrogen from the in-process substrate, which is known to passivate acceptor impurities rendering them electronically inactive.

Figure 9:
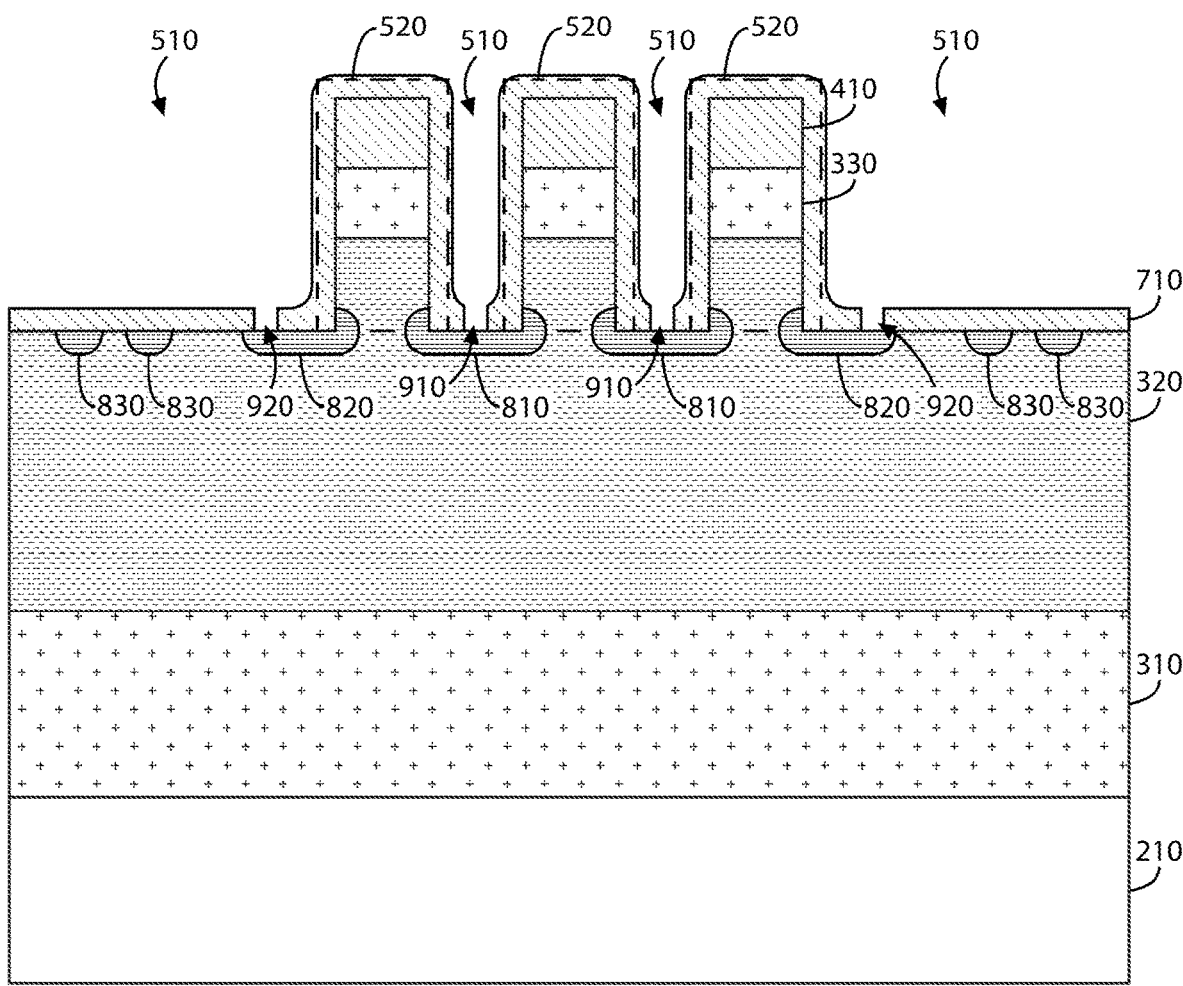

In an example, referring to FIG. 9, the method includes forming a plurality of p-type metal contact regions. As shown, a photolithograph technique and plasma or reactive ion etching using a fluorine based entity forms a plurality of contact openings 910 as shown. A contact opening 910 is formed on a bottom portion of each of the trench regions 510 to expose the p-type implanted regions 810. A contact opening 920 is formed on each peripheral region to expose the p-type implanted regions 820 adjacent to an outer finger region.

Figure 10:
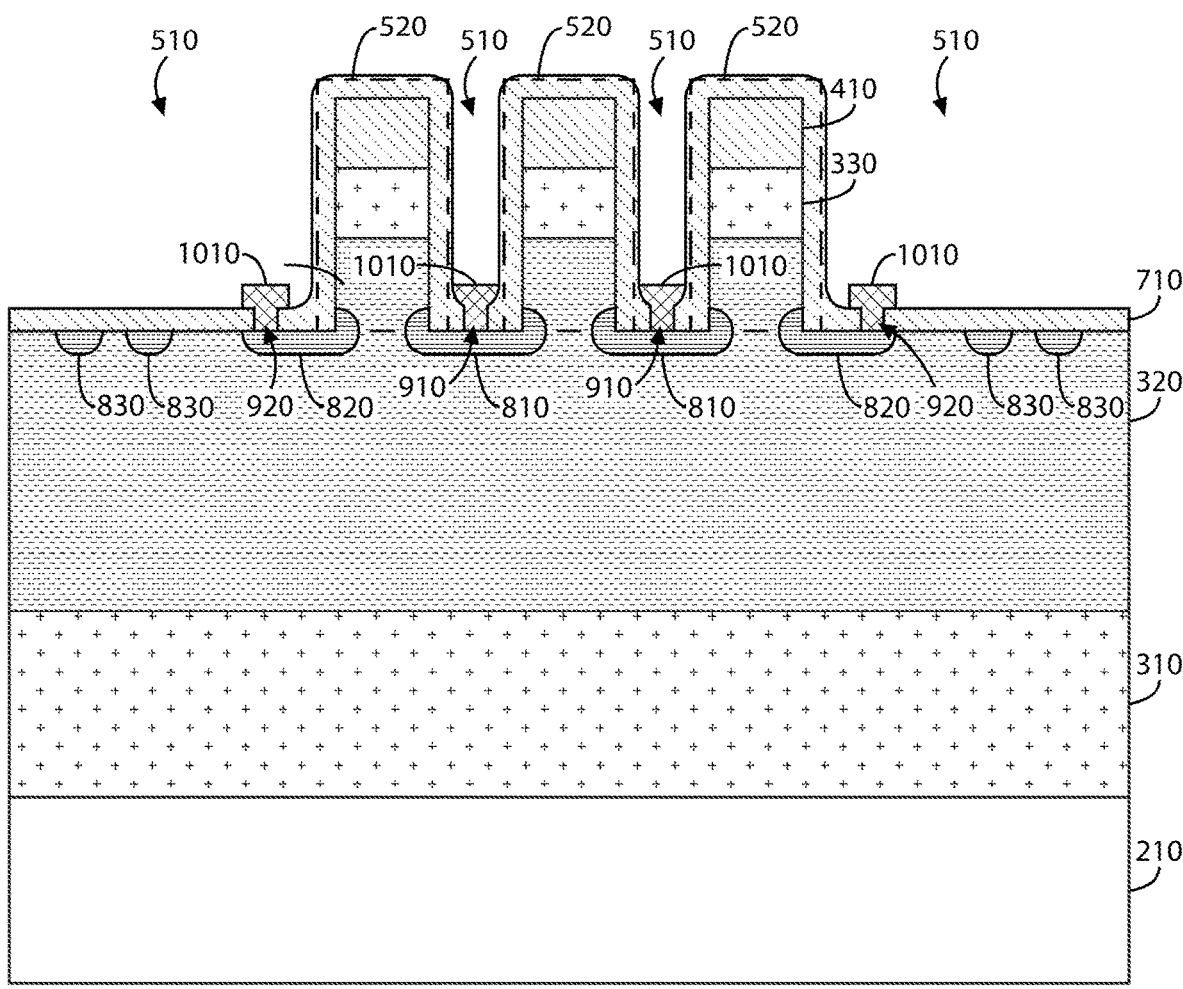

Referring to FIG. 10, the method includes forming a p-type metal contact region 1010 overlying at least one of the exposed p-type regions. In an example, each of the exposed p-type implanted regions has a p-type metal contact region 1010. In an example, each of the p-type metal contact regions is an ohmic contact. Various types of metals can include nickel-gold, and others.

Figure 11:
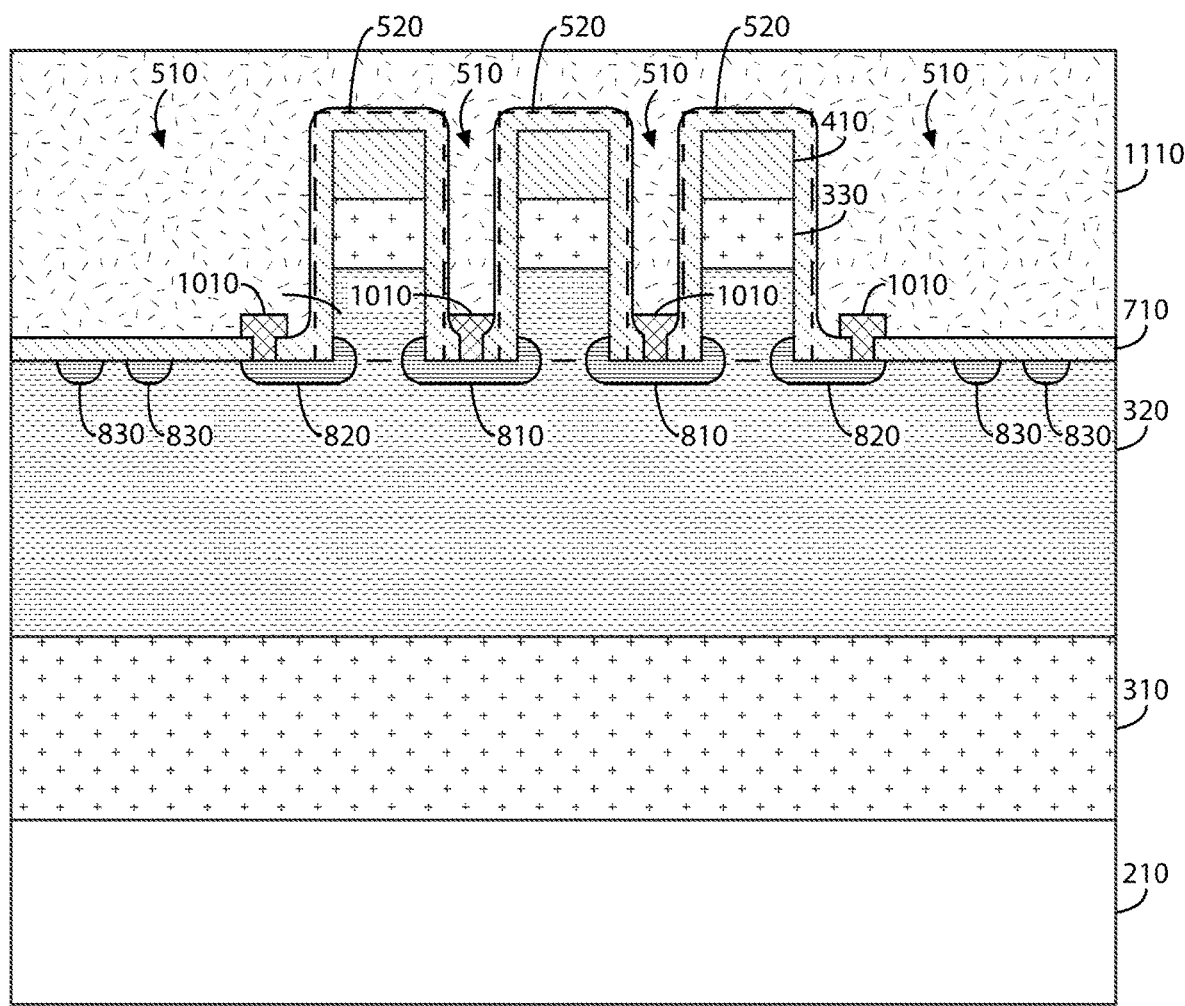

Referring to FIG. 11, the method forms a thickness of planarizing material 1110 overlying a surface region including each of the finger regions 520, the trench regions 510, and the peripheral region. In an example, the planarizing material 1110 can be an oxide, a PECVD oxide, or spin-on oxide material. In an example, the planarizing material 1110 can include at least one of SiN, a mixed dielectric AlSiN, or AlN.

Figure 12:
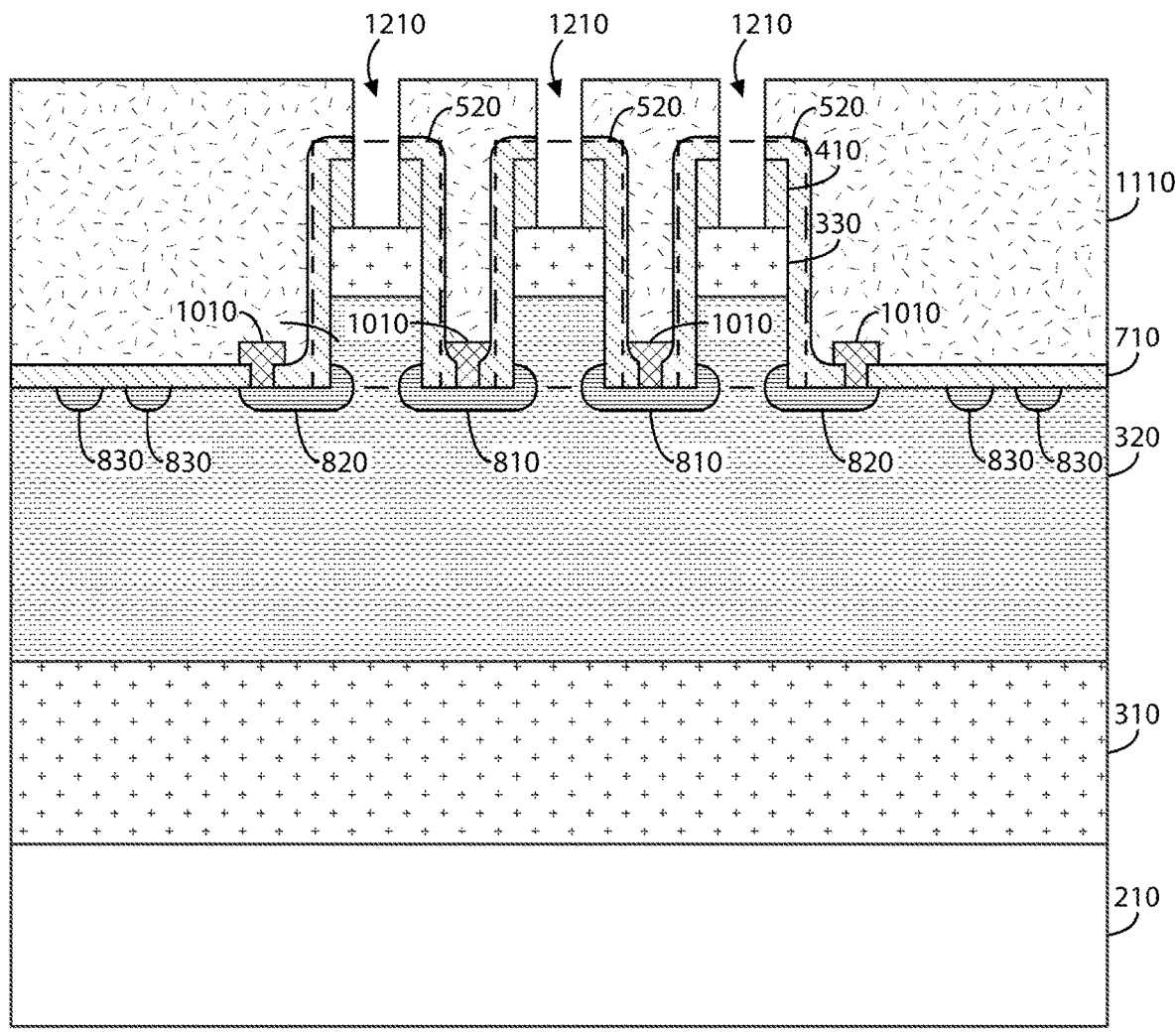
Figure 13:
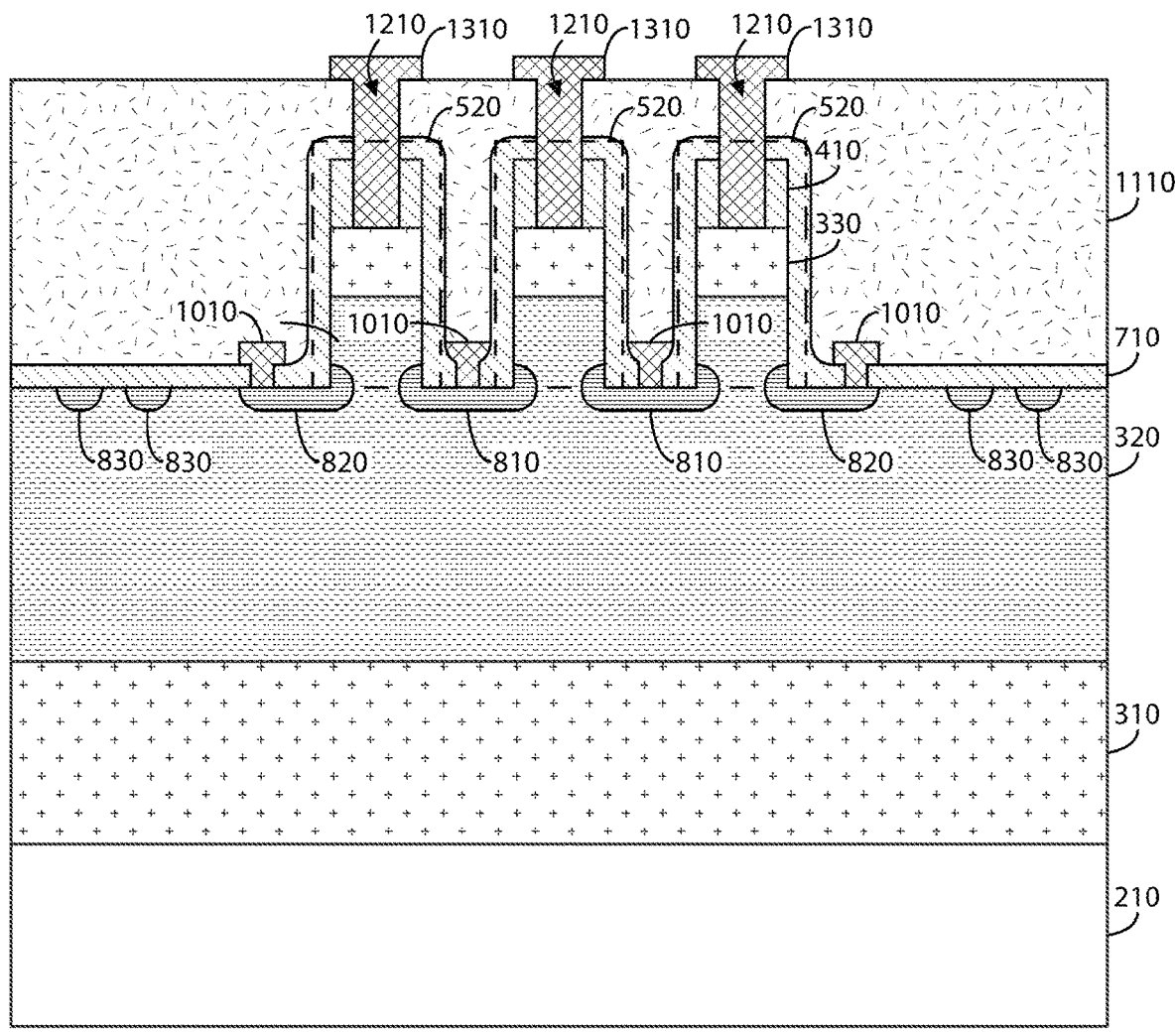

In an example, the method includes forming a plurality of openings 1210, each of the openings 1210 exposing a portion of the second n+ type layer 410 included in the finger regions 520, as shown in the FIG. 12. The openings 1210 are formed using a photolithography process. In an example, the method includes forming a plurality of n-type contact metal regions 1310 within the plurality of openings 1210, as shown in FIG. 13. Each of n-type metal contact regions 1310 is connected to the portion of the n– type layer 330 included in the finger regions 520.

Figure 14:
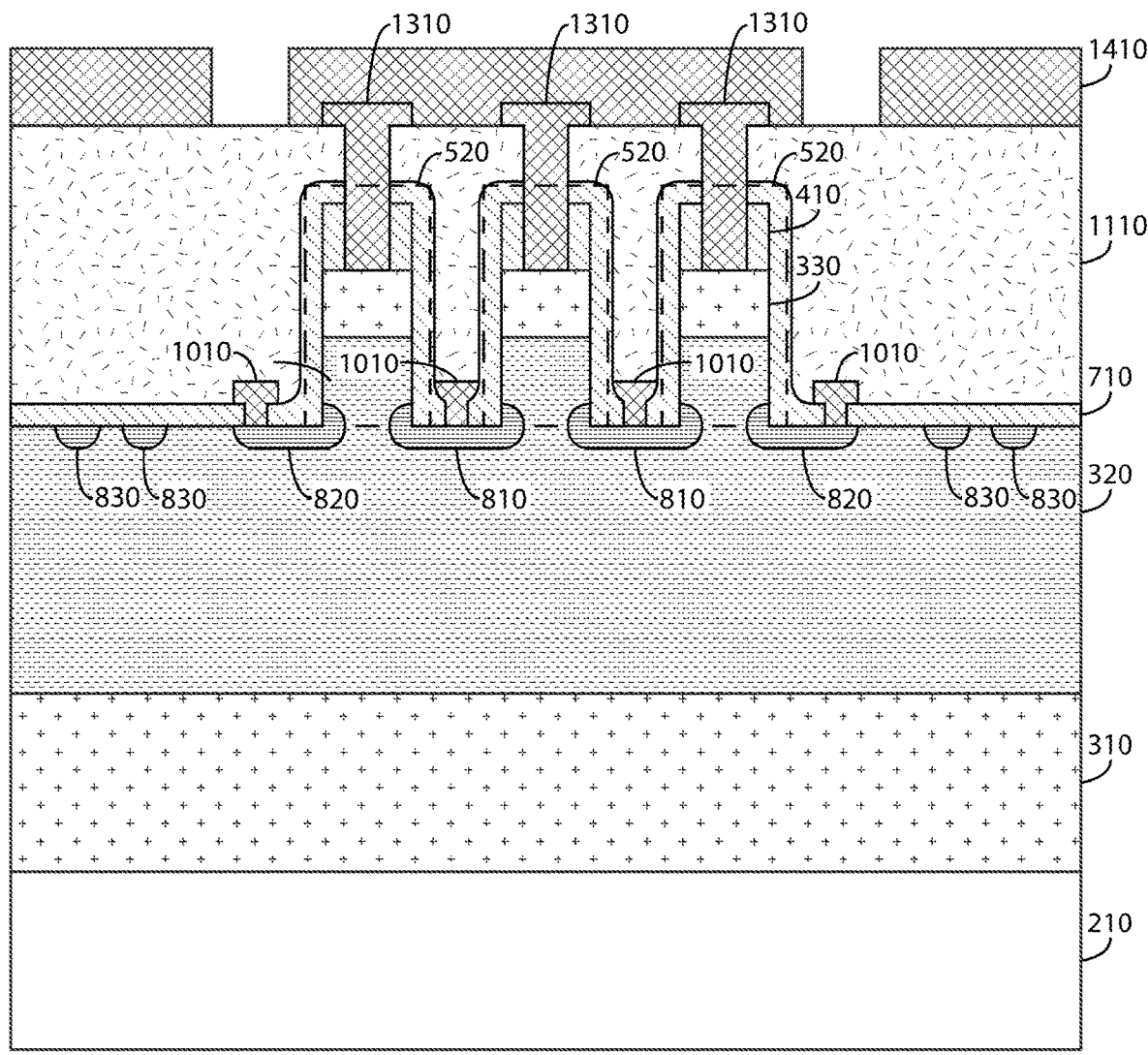

As shown in FIG. 14, the method includes forming a pad contact metal layer 1410 connecting each of the n-type contact metal regions 1310. The pad contact metal layer 1410 also connects each of the gate regions configured by the p-type metal contact regions 1010.

The high voltage switching device is configured from a drain region configured from the backside region of the gallium and nitrogen containing substrate member, a gate region configured from a connection to each of the p-type metal contact regions 1010, a channel region configured between a pair of p-type regions, and a source region configured from connection to each of the n-type contact metals 1310. In an example, the GaN substrate 110 is removed by a wafer grinding, etching, or other like thinning or removal process. In an example, the drain region is configured from a backside region of the first n+ type GaN layer.

The above sequence of steps is used to form high voltage FET devices on a die from a substrate structure according to one or more embodiments of the present invention. Depending upon the embodiment, one or more of these steps can be combined, or removed, or other steps may be added without departing from the scope of the claims herein. One of ordinary skill in the art would recognize other variations, modifications, and alternatives.

While the above is a full description of the specific embodiments, various modifications, alternative constructions and equivalents may be used. As an example, the implanted gallium and nitrogen containing region can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention, which is defined by the appended claims.

What is claimed is:

1. A method of fabricating a vertical FET device fabricated in GaN, the method comprising:
   providing a GaN substrate comprising a surface region and a backside region;
   forming an n-type GaN epitaxial layer overlying the surface region;
   forming a plurality of finger regions, each of the finger regions having a portion of the n– type GaN epitaxial layer, an n+ type portion; and a capping layer; and configured with a plurality of recessed regions, each of the recessed regions between each pair of finger regions;
   forming an n– type GaN channel comprising a doping level and a thickness selected to provide a large gate-drain breakdown voltage in a range from 100 volts to 20 kilo-volts;
   forming an n+ type source configured from the n+ type portion of the finger region;
   performing a selective area implant region comprising an activated impurity, selected from at least one of Be, Mg, Zn, Ca, and Cd, configured from a bottom portion of the recessed regions, and configured to be substantially free from ion implant damage using an annealing process;
   forming a p-type gate region configured from the selective area implant region;
   forming a depth characterizing each of the recessed regions configured to provide physical separation between the n+ type source region and the p-type gate region such that a low reverse leakage gate-source p-n junction is achieved;
   forming an extended drain region configured from a portion of n– type GaN region underlying the recessed regions;

forming an n+ GaN region formed by epitaxial growth directly overlying the backside region of the GaN substrate; and forming a backside drain contact region configured from the n+ type GaN region overlying the backside region.

2. The method of claim 1 wherein the n+ source region or regions are provided by a donor impurity ion implantation and a subsequent annealing process.

3. The method of claim 1 wherein the source region or regions are provided with silicon as a donor impurity.

4. The method of claim 1 wherein the channel region or regions are provided with a silicon as a donor impurity.

5. The method of claim 1 further comprising a built-in voltage of a gate-source diode is approximately 3 volts to achieve a wider channel width as compared to a metal-insulator-semiconductor gate structure for a normally-off enhancement mode device.

6. The method of claim 1 further comprising a dielectric spacer layer deposited conformally overlying the recessed regions to limit a lateral penetration of a subsequent ion implant of acceptors into the n-type GaN channel.

7. The method of claim 1 further comprising a dielectric spacer layer deposited conformally overlying the recessed regions to encapsulate and passivate a plurality of GaN exposed surfaces between the n+ type source and the p-type gate region.

8. The method of claim 1 further comprising a trench region configured around a periphery of a device region, the trench region comprising a dielectric fill material and configured to form an isolation region.

9. The method of claim 8 wherein the dielectric fill material is at least one of SiN, a mixed dielectric AlSiN, or AlN.

10. The method of claim 1 wherein the GaN substrate is n+ type.

11. A method of fabricating a vertical FET device fabricated in GaN, the method comprising:

providing a GaN substrate comprising a surface region and a backside region;

forming an n-type GaN epitaxial layer overlying the surface region;

forming a plurality of finger regions, each of the finger regions having a portion of the n− type GaN epitaxial layer, an n+ type portion; and a capping layer; and configured with a plurality of recessed regions, each of the recessed regions between each pair of finger regions;

forming an n− type GaN channel comprising a doping level and a thickness selected to provide a large gate-drain breakdown voltage in a range from 100 volts to 20 kilo-volts;

forming an n+ type source configured from the n+ type portion of the finger region;

performing a selective area implant region comprising an activated impurity, selected from at least one of Be, Mg, Zn, Ca, and Cd, configured from a bottom portion of the recessed regions, and configured to be substantially free from ion implant damage using an annealing process;

forming a p-type gate region configured from the selective area implant region;

forming a depth characterizing each of the recessed regions configured to provide physical separation between the n+ type source region and the p-type gate region such that a low reverse leakage gate-source p-n junction is achieved, and an extended drain region configured from a portion of n− type GaN region underlying the recessed regions;

forming an n+ GaN region formed by epitaxial growth directly overlying the backside region of the GaN substrate; and forming a backside drain contact region configured from the n+ type GaN region overlying the backside region.

12. The method of claim 11 wherein the n+ source region or regions are provided by a donor impurity ion implantation and a subsequent annealing process.

13. The method of claim 11 wherein the source region or regions are provided with silicon as a donor impurity.

14. The method of claim 11 wherein the channel region or regions are provided with a silicon as a donor impurity.

15. The method of claim 11 further comprising a built-in voltage of a gate-source diode is approximately 3 volts to achieve a wider channel width as compared to a metal-insulator-semiconductor gate structure for a normally-off enhancement mode device.

16. The method of claim 11 further comprising a dielectric spacer layer deposited conformally overlying the recessed regions to limit a lateral penetration of a subsequent ion implant of acceptors into the n-type GaN channel.

17. The method of claim 11 further comprising a dielectric spacer layer deposited conformally overlying the recessed regions to encapsulate and passivate a plurality of GaN exposed surfaces between the n+ type source and the p-type gate region.

18. The method of claim 11 further comprising a trench region configured around a periphery of a device region, the trench region comprising a dielectric fill material and configured to form an isolation region.

19. The method of claim 18 wherein the dielectric fill material is at least one of SiN, a mixed dielectric AlSiN, or AlN.

20. The method of claim 11 wherein the GaN substrate is n+ type.

* * * * *